(12) United States Patent
Tian et al.

(10) Patent No.: US 11,853,145 B2
(45) Date of Patent: Dec. 26, 2023

(54) POWER SOURCE MANAGEMENT SYSTEM AND POWER SOURCE MANAGEMENT METHOD FOR SRAM CIRCUIT, AND FPGA CHIP

(71) Applicant: SHENZHEN PANGO MICROSYSTEMS CO., LTD, Shenzhen (CN)

(72) Inventors: Lei Tian, Shenzhen (CN); Yinghao Liao, Shenzhen (CN)

(73) Assignee: SHENZHEN PANGO MICROSYSTEMS CO., LTD, Shenzhen (CN)

(*) Notice: Subject to any disclaimer, the term of this patent is extended or adjusted under 35 U.S.C. 154(b) by 100 days.

(21) Appl. No.: 17/732,491

(22) Filed: Apr. 28, 2022

(65) Prior Publication Data

US 2022/0283626 A1 Sep. 8, 2022

Related U.S. Application Data

(63) Continuation of application No. PCT/CN2020/129082, filed on Nov. 16, 2020.

(30) Foreign Application Priority Data

Feb. 14, 2020 (CN) .......................... 202010095846.3

(51) Int. Cl.
*G06F 1/32* (2019.01)
*G06F 1/3234* (2019.01)

(52) U.S. Cl.
CPC ................................ *G06F 1/3275* (2013.01)

(58) Field of Classification Search
CPC ..................................................... G06F 1/3275
See application file for complete search history.

(56) References Cited

U.S. PATENT DOCUMENTS

2006/0106990 A1  5/2006  Michael et al.

FOREIGN PATENT DOCUMENTS

CN      1776650 A     5/2006
CN    102034533 A     4/2011
           (Continued)

OTHER PUBLICATIONS

CNIPA, First Office Action for CN Application No. 202010095846.3, dated Dec. 30, 2020.
(Continued)

*Primary Examiner* — Zahid Choudhury

(57) ABSTRACT

A power management system and method for an SRAM circuit and an FPGA chip are provided. The power management system includes a power management, a power management controller and an oscillator. The power management circuit include a power-on reset circuit used to determine whether powering-on of a core voltage and an analog input-output voltage of power supply voltages of the power management circuit is completed. The power management controller and the oscillator are used to control the power management circuit to power on the SRAM circuit after the power-on reset circuit determines that the powering-on of the core voltage and the analog input-output voltage is completed, and further used to control the power management circuit to erase the SRAM circuit after the SRAM circuit is powered on. Powering-on sequences of various internal power supplies of the FPGA chip are clear, and power consumption of the FPGA chip can be reduced.

20 Claims, 3 Drawing Sheets

(56) References Cited

FOREIGN PATENT DOCUMENTS

| | | |
|---|---|---|
| CN | 202475390 U | 10/2012 |
| CN | 105097017 A | 11/2015 |
| CN | 105720958 A | 6/2016 |
| CN | 108197063 A | 6/2018 |
| CN | 110135199 A | 8/2019 |

OTHER PUBLICATIONS

CNIPA, Second Office Action for CN Application No. 202010095846.3, dated Aug. 18, 2021.
WIPO, International Search Report for PCT Application No. PCT/CN2020/129082, dated Feb. 19, 2021.
Written Opinion of the International Searching Authority for No. PCT/CN2020/129082.
CNIPA, Office Action issued for on Application No. 202010095848.3, dated Apr. 19, 2022.

POWER SOURCE MANAGEMENT SYSTEM AND POWER SOURCE MANAGEMENT METHOD FOR SRAM CIRCUIT, AND FPGA CHIP

CROSS-REFERENCE TO RELATED APPLICATIONS

The present disclosure is a continuation of International Application NO. PCT/CN/2020/129082, filed on Nov. 16, 2020. The International Application claims priority from Chinese patent application No. 202010095846.3, filed on Feb. 14, 2020. The entire contents of the above-mentioned applications are hereby incorporated by reference in their entirety.

TECHNICAL FIELD

The present disclosure relates to the field of semiconductor technologies, and in particularly, to a power management system for a static random access memory (SRAM) circuit and a power management method for a SRAM circuit, and a field programmable gate array (FPGA) chip.

BACKGROUND

At present, there are a large number of SRAM modules (hereinafter referred to SRAM circuits) in a FPGA chip. Before powering-on of the FPGA chip is completed, the SRAM circuits are needed to be erased. In the design of the FPGA chip, in order to make a processing speed of the FPGA chip be faster, the SRAM circuits are usually supplied with power individually, and a power supply voltage supplied to the SRAM circuits is usually higher than a normal power supply voltage of a CORE (internal core, simply as CORE) module in the FPGA chip. The power supply voltage of the CORE module (also referred to as core voltage) is a standard voltage based on its manufacturing process.

In the related art, there is no fixed requirement for power-on sequences of various power supplies. In an application process, if the SRAM voltage is powered on excessively fast while the core voltage is powered on relatively slow, the SRAM circuits cannot be erased in time before the powering-on of the SRAM circuits is completed, an internal logic is prone to confusion, resulting in relatively large power consumption.

SUMMARY

The disclosure provides a power management system for a SRAM circuit, a power management method for a SRAM circuit, and a FPGA chip.

In a first aspect, the present disclosure provides a power management system for a SRAM circuit, the power management system is adopted for a FPGA chip. The power management system includes: a power management circuit, a power management controller and an oscillator. The power management circuit is configured to supply power to the SRAM circuit, and power supply voltages of the power management circuit include a core voltage and an analog input-output voltage. The power management circuit includes a power-on reset circuit, configured (i.e., structured and arranged) to determine whether powering-on of the core voltage and the analog input-output voltage is completed. The power management controller and the oscillator are configured to control the power management circuit to power on the SRAM circuit after the power-on reset circuit determines that the powering-on of the core voltage and the analog input-output voltage is completed. The power management controller and the oscillator are further configured to control the power management circuit to erase the SRAM circuit after the SRAM circuit is powered on.

In an embodiment, the SRAM circuit includes a SRAM array, a word line drive circuit and a bit line drive circuit; and the power management circuit powers on the SRAM circuit, includes: the power management controller and the oscillator control the power management circuit to power on the word line drive circuit with the core voltage; and the power management controller and the oscillator control the power management circuit to power on the SRAM array with a set voltage, after the word line drive circuit is powered on; the set voltage is greater than the core voltage.

In an embodiment, the power management controller and the oscillator are configured to control the power management circuit to pull up a power supply voltage of the word line drive circuit to be no less than the set voltage after the SRAM array is powered on but before the SRAM array is erased; and the power supply voltage of the word line drive circuit is no less than the set voltage in response to the power management circuit erasing the SRAM array.

In an embodiment, a magnitude of the set voltage is decreased with an increase of a junction temperature of the FPGA chip. It ensures that the running speed and reliability of the FPGA chip.

In an embodiment, the power management circuit further includes: a bandgap reference circuit, a power supply voltage of the bandgap reference circuit is the analog input-output voltage, and the power-on reset circuit is connected to an output end of the bandgap reference circuit; a first low dropout (LDO) regulator, connected to an output end of the bandgap reference circuit and configured to supply power to the word line drive circuit; and a second LDO regulator, connected to the bandgap reference circuit and configured to supply power to the SRAM array.

In an embodiment, the power management circuit further includes: a switch circuit, configured to provide stabilized the core voltage to the word line drive circuit, and the switch circuit is connected to an output end of the first LDO regulator.

In an embodiment, the second LDO regulator is connected to an output end of the bandgap reference circuit, and an output end of the second LOD regulator is connected to the SRAM array, and the second LDO regulator is configured to supply power to the SRAM array.

In an embodiment, the power management controller and the oscillator are configured to control the power management circuit to program the SRAM circuit after the SRAM circuit is erased; and the power supply voltage of the word line drive circuit is no less than the set voltage in response to the power management circuit programming the SRAM circuit.

In an embodiment, the power management controller and the oscillator are configured to control the power management circuit to read the SRAM circuit after the power management circuit programs the SRAM circuit; and the power management controller and the oscillator are configured to control the power management circuit to pull down the power supply voltage of the word line drive circuit to the core voltage after the power management circuit programs the SRAM circuit but before reads the SRAM circuit.

In an embodiment, the power management controller includes three logic delay circuits and a logic control circuit, and the three logic circuits and the logic circuit are connected to the oscillator.

In a second aspect, the present disclosure provides a FPGA chip, the FPGA chip includes: a SRAM circuit; and any one of the above power management systems.

In an embodiment, the FPGA chip includes a control circuit, the control circuit is connected to the power management controller and the oscillator of the power management system, the control circuit is configured to issue different control signals to the power management controller and the oscillator, and the different control signals include an erase signal, a programming signal and a reading signal.

In a third aspect, the present disclosure provides a power management method corresponding to the above power management system for the SRAM circuit, the power management method includes: the power management controller and the oscillator control the power management circuit to power on the SRAM circuit, after the power-on reset circuit determines that the powering-on of the core voltage and the analog input-output voltage is completed; and the power management controller and the oscillator control the power management circuit to erase the SRAM circuit, after the power management circuit powers on the SRAM circuit.

In an embodiment, the SRAM circuit includes a SRAM array, a word line drive circuit and a bit line drive circuit. The power management circuit powers on the SRAM circuit, includes: the power management controller and the oscillator control the power management circuit to power on the word line drive circuit with the core voltage; and the power management controller and the oscillator control the power management circuit to power on the SRAM array with a set voltage, after the word line drive circuit is powered on; wherein the set voltage is greater than the core voltage.

In an embodiment, the power management controller and the oscillator control the power management circuit to power on the SRAM array with the set voltage, includes: the power management controller and the oscillator control a second LDO regulator of the power management circuit to power on the SRAM array with the set voltage.

In an embodiment, the power management method further includes: the power management controller and the oscillator control the power management circuit to pull up a power supply voltage of the word line drive circuit to be no less than the set voltage, after the power management circuit powers on the SRAM array but before erases the SRAM array; and the power supply voltage of the word line drive circuit is no less than the set voltage in response to the power management circuit erasing the SRAM array.

In an embodiment, the power management controller and the oscillator control the power management circuit to pull up the power supply voltage of the word line drive circuit to be no less than the set voltage, includes: the power management controller and the oscillator control a first LDO regulator of the power management circuit to pull up the power supply voltage of the word line drive circuit to be no less than the set voltage.

In an embodiment, the power management method further includes: the power management controller and the oscillator control the power management circuit to program the SRAM array, after the power management circuit erases the SRAM circuit; and the power supply voltage of the word line drive circuit is no less than the set voltage in response to the power management circuit programming the SRAM circuit.

In an embodiment, the power management method further includes: the power management controller and the oscillator control the power management circuit to pull down the power supply voltage of the word line drive circuit to be the core voltage, after the power management circuit programs the SRAM circuit; and the power management controller and the oscillator control the power management circuit to read the SRAM array, and the power supply voltage of the word line drive circuit is equal to the core voltage in response to the power management circuit reading the SRAM array.

In an embodiment, the power management controller and the oscillator control the power management circuit to power on the word line drive circuit with the core voltage, includes: the power-on reset circuit transmits a powering-on and resetting completion signal to the power management controller and the oscillator, in response to the power-on reset circuit determining that the powering-on of the core voltage and the analog input-output voltage is completed; the power management controller and the oscillator, after receiving powering-on and resetting completion signal, use a timing function of the oscillator to delay a first time length and then enable the power management circuit to power on the word line drive circuit.

DESCRIPTION OF REFERENCE NUMERALS

10—FPGA chip, 20—power management system, 21: power management circuit, 211: bandgap reference circuit, 212—power-on reset circuit, 213—first LDO regulator, 214—switch circuit, 215—second LDO regulator, 22—power management controller, 221—logic delay circuit, 222—logic control circuit, 23—oscillator, 30—SRAM circuit, 31—word line drive circuit, 32—bit line drive circuit, 33—SRAM array, 40—control circuit.

DETAILED DESCRIPTION OF EMBODIMENTS

In order to make the objects, technical solutions and advantages of the present disclosure clearer, the present disclosure will be further described in detail in combination with the attached drawings.

In order to facilitate the understanding of a power management system for a SRAM circuit provided by embodiments of the present disclosure, the following first describes an application scenario of the power management system for the SRAM circuit provided by the embodiments of the present disclosure. The power management system for the SRAM circuit is adopted for a FPGA chip to manage a power supply mode of the SRAM circuit in the FPGA chip. The FPGA chip includes the SRAM circuit and the power management system for the SRAM circuit. The power management system for the SRAM circuit is described in detail below in combination with the attached drawings.

Figure 1:
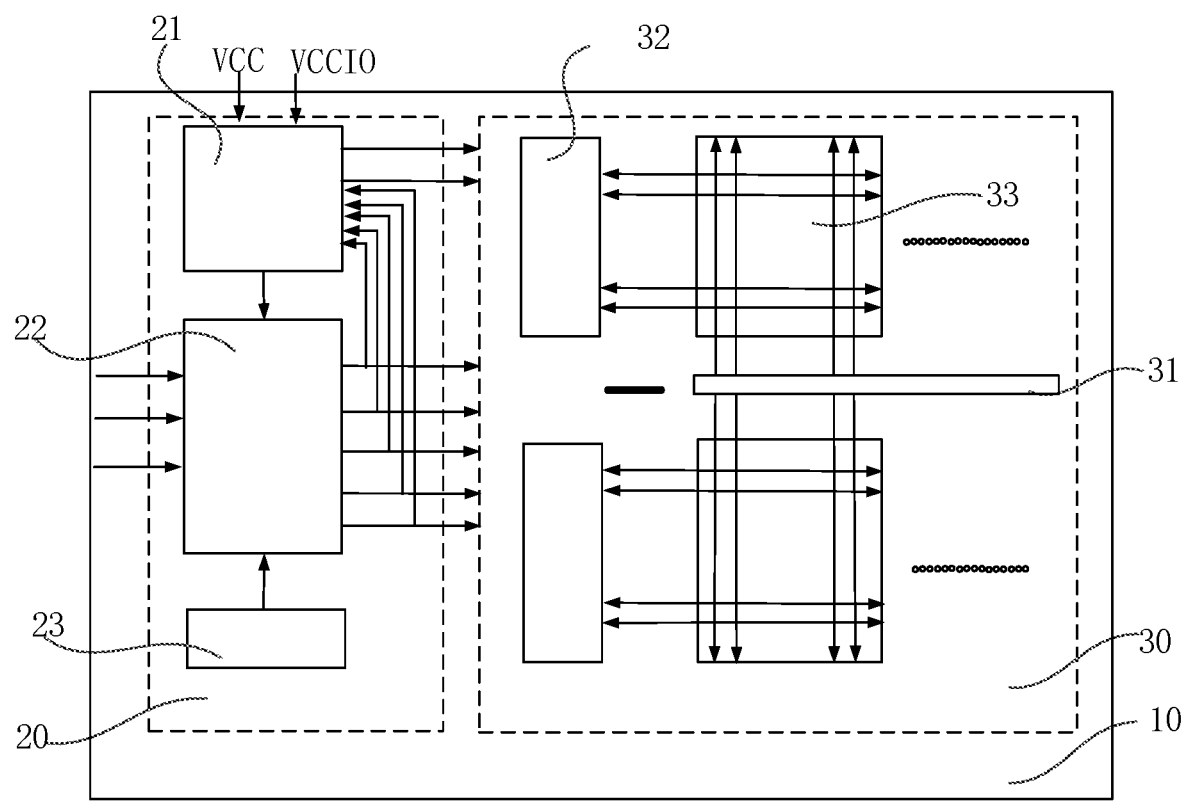
FIG. 1 illustrates a schematic structural view of a FPGA chip applicable to an embodiment of the present disclosure.
Figure 2:
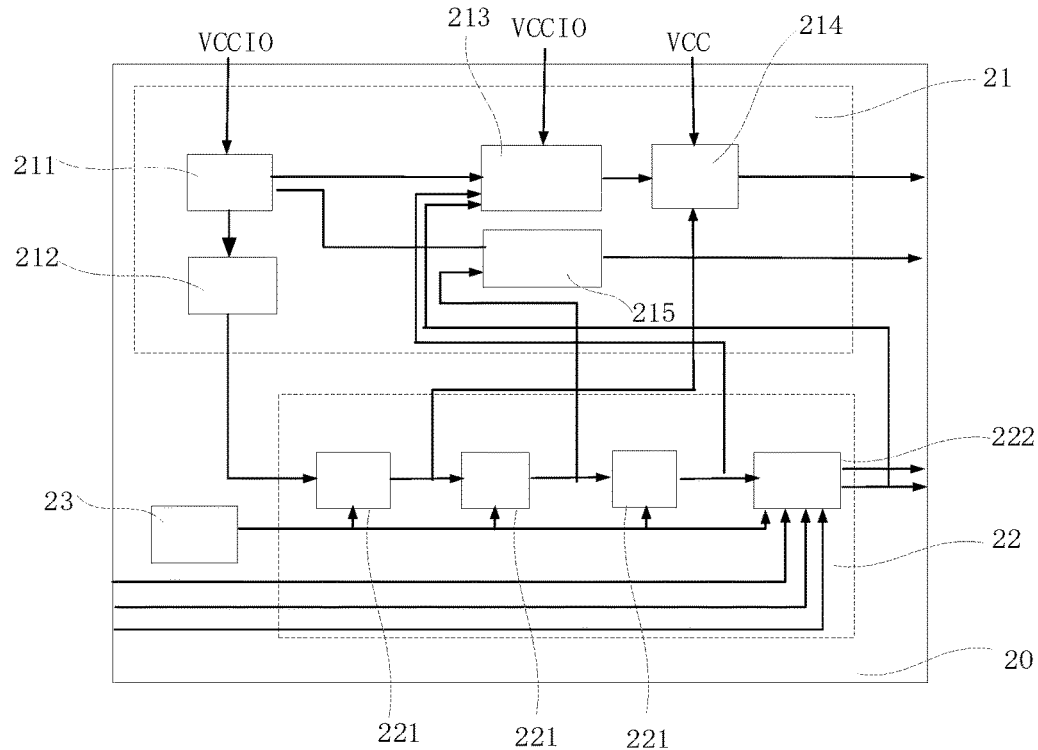
FIG. 2 illustrates a schematic structural view of a power management system for SRAM of the FPGA chip applicable to an embodiment of the present disclosure.

Referring to FIGS. 1 and 2, the power management system 20 for the SRAM circuit 30 provided by an embodiment of the present disclosure includes a power management circuit 21, a power management controller 22 and an oscillator (OSC) 23 to manage the power supply mode of the SRAM circuit 30 in the FPGA chip 10. The power management circuit 21 is configured to supply power to the SRAM circuit 30. Power supply voltages of the power management circuit 21 includes a core voltage (VCC) and an analog input-output voltage (VCCIO). The core voltage and the analog input-output voltage are common voltage types in the FPGA chip 10 in the related art. As shown in FIG. 2, the power management circuit 21 includes a power-on reset circuit (POR) 212 configured to determine whether powering-on of the core voltage and the analog input-output voltage is completed. The power management controller 22 and the oscillator 23 are configured to control the power management circuit 21 to power on the SRAM circuit 30 after the power-on reset circuit 212 determines that the powering-on of the core voltage and the analog input-output voltage is completed. The power management controller 22 and the oscillator 23 are further configured to control the power management circuit to erase the SRAM circuit 30 after the SRAM circuit 30 is powered on.

In the above solution, the power-on reset circuit 212 is designed to determine whether the powering-on of the core voltage and the analog input-output voltage is completed, after the power-on reset circuit 212 determines that the powering-on of the core voltage and the analog input-output voltage is completed, the power management controller 22 and the oscillator 23 control the power management circuit 21 to power on the SRAM circuit 30, after the SRAM circuit 30 is powered on, the power management controller 22 and the oscillator 23 control the power management circuit to erase the SRAM circuit 30. By using a method of powering-on and then erasing, power-on sequences of internal power supplies are clear, which can avoid internal logic confusion caused by the failure completions of powering-on and erasing at the same time, thereby reduce the power consumption of the chip.

Referring to FIG. 2, the power management circuit 21 includes a bandgap reference circuit 211, and a power supply voltage of the bandgap reference circuit 211 is the analog input-output voltage. The power-on reset circuit 212 is connected to an output of the bandgap reference circuit 211 to determine whether the powering-on of the core voltage and the analog input-output voltage in the FPGA chip 10 is completed. The bandgap reference circuit 211 is designed to provide a stable reference voltage to the power management circuit 21 to improve the running speed of the SRAM circuit 30. It should be understood that the bandgap reference circuit 211 is an unnecessary component in the power management circuit 21, and the analog input-output voltage can also be directly connected to the power-on reset circuit 212.

Referring to FIGS. 1 and 2, the SRAM circuit 30 includes a SRAM array 33, a word line drive circuit 31 (WLDR), and a bit line drive circuit 32 (BLDR). The SRAM array 33 is configured to store data. The word line drive circuit 31 and the bit line drive circuit 32 are configured to read and write the data. The bit line drive circuit 32 can be configured to receive different read and write data sent by the SRAM array 33 (DATAN<M>, DATAN<N>, DATA<M and DATAN<M>). The word line drive circuit 31 can be configured to send different read and write addresses (ADD/ADDR<P>). In the specific designing, the SRAM array 33, the word line drive circuit 31 and the bit line drive circuit 32 are structures commonly used in the related art.

Figure 3:
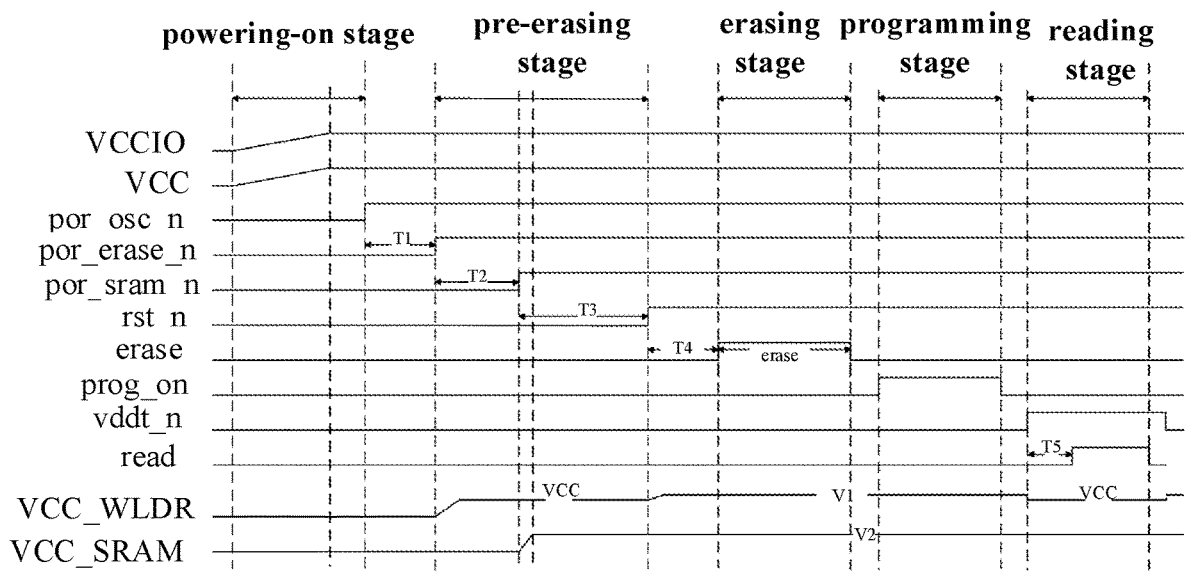
FIG. 3 illustrates a timing schematic view during the work of the power management system for SRAM of the FPGA chip applicable to an embodiment of the present disclosure.
Figure 4:
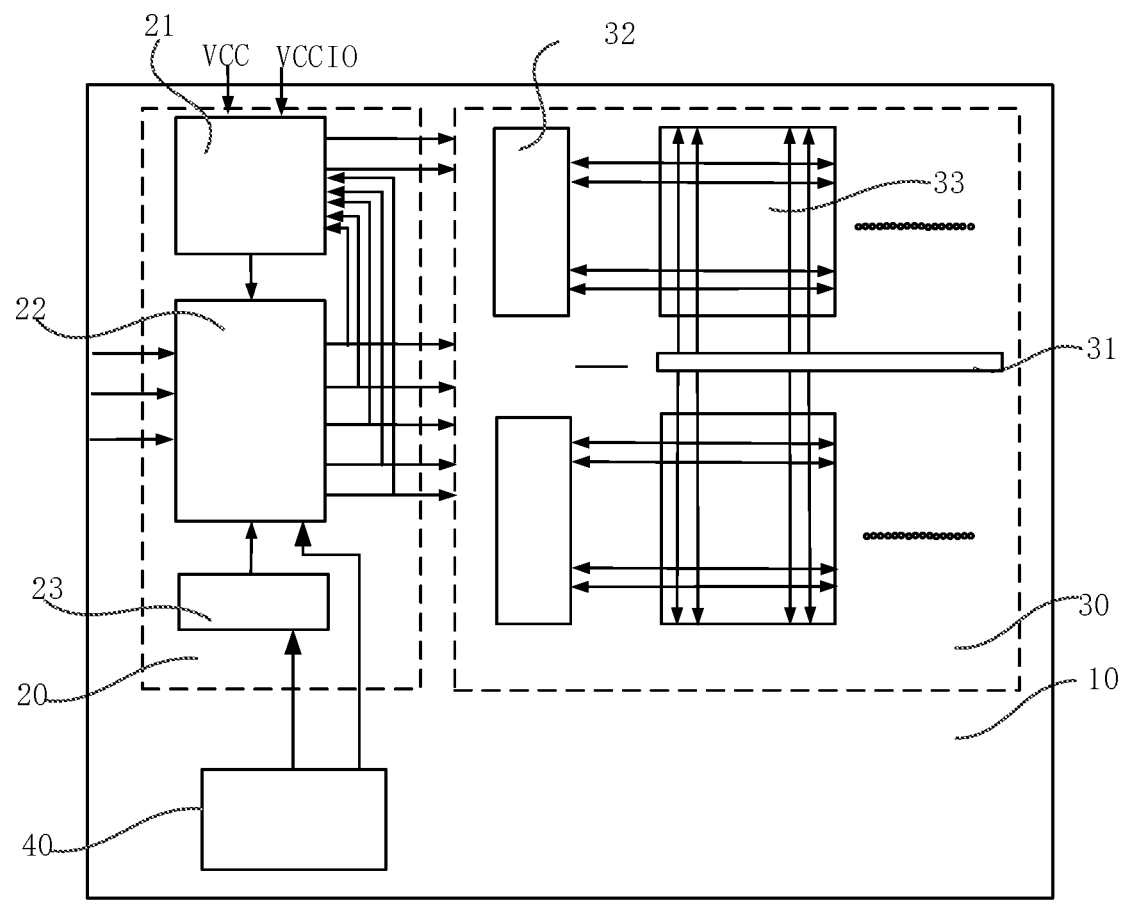
FIG. 4 illustrates a schematic structural view of another FPGA chip applicable to an embodiment of the present disclosure.

When the power management circuit 21 powers on the SRAM circuit 30, it first powers on the word line drive circuit 31 and then powers on the SRAM array 33, that is, it uses time-sharing power on to ensure that the SRAM array 33 will not have large current during the powering-on, thereby to facilitate data locking into the SRAM array 33. As shown in FIG. 3, a process of powering on the word line drive circuit 31 and then on the SRAM array 33 can be called the pre-erasing stage.

The power management controller 22 and the oscillator 23 control the power management circuit 21 to power on the word line drive circuit 31 with the core voltage, in response to the power management circuit 21 powering on the word line drive circuit 31. That is, after the power-on reset circuit 212 in the power management circuit 21 determines that the powering-on of the core voltage and the analog input-output voltage is completed, the power-on reset circuit 212 transmits a powering-on and resetting completion signal (which can be represented by por_n signal) to the power management controller 22 and the oscillator 23, and after the power management controller 22 and the oscillator 23 receive the por_n signal, the power management controller 22 and the oscillator 23 use a timing function of the oscillator 23 to delay a time length T1, and then enable the power management circuit 21 to power on the word line drive circuit 31 with the core voltage.

In the specific designing, referring to FIG. 2, the power management circuit 21 may include a first LDO regulator 213 connected to an output of the bandgap reference circuit 211 and configured to supply power to the word line drive circuit 31. The first LDO regulator 213 is configured to provide different voltage signals to the word line drive circuit 31, and the first LDO regulator 213 is connected to the output of the bandgap reference circuit 211, thereby to obtain an accurate reference voltage and generate an accurate output power supply, thus to improve the running speed of the SRAM circuit 30. It should be noted that the first LDO regulator 213 is not limited to the way of connecting to the output of the bandgap reference circuit 211, but can also be directly connected to the output of the analog input-output voltage.

Continuing to refer to FIGS. 1 and 2, the power management circuit 21 can include a switch circuit 214 connected to an output of the first LDO regulator 213. One of power supply voltages of the switch circuit 214 is the core voltage to provide the stable core voltage to the word line drive circuit 31. The first LDO regulator 213 is a conventional LDO regulator in the related art. When it is necessary to adjust an input voltage (which can be represented by VCC_WLDR) of the word line drive circuit 31, the power management controller 22 can transmit the input voltage (VCC_WLDR) to the first LDO regulator 213 to change the word line drive circuit 31, thereby the first LDO regulator 213 cooperates with the switch circuit 214 and the core voltage to provide different input voltages to the word line drive circuit 31. Referring to FIG. 2 and FIG. 3, after the power management controller 22 and the oscillator 23 receive the por_n signal, the power management controller 22 and the oscillator 23 use the timing function of the oscillator 23 to delay the first time length T1, and then transmits a signal (which can be represented by por_erase_n) enabling the power management circuit 21 to power on the word line drive circuit 31 to the first LDO regulator 213. It should be understood that the above only shows one way in which the power management circuit 21 supplies power to the word line drive circuit 31. In addition, other ways can be adopted.

Referring to FIGS. 1, 2 and 3, after the power management controller 22 and the oscillator 23 control the power management circuit 21 to power on the word line drive circuit 31, the power management controller 22 and the oscillator 23 control the power management circuit 21 to power on the SRAM array 33 with a set voltage (which can be represented by VCC_SRAM). The set voltage (V2 in FIG. 3 represents the set voltage) is greater than the core voltage (VCC in FIG. 3 represents the core voltage). By adopting that the power supply voltage (the set voltage) of the SRAM array 33 is greater than the core voltage, the running speed of the SRAM circuit 30 is improved.

When the power management circuit 21 supplies power to the SRAM array 33, referring to FIG. 2, the power management circuit 21 can include a second LDO regulator 215 connected to the bandgap reference circuit 211 and configured to supply power to the SRAM array 33. Specifically, the second LDO regulator 215 is connected to an output of the bandgap reference circuit 211, and an output of the second LDO regulator 215 is connected to the SRAM array 33 to supply power to the SRAM array 33. Referring to FIG. 2, the power management controller 22 may first transmit a signal changing an output voltage of the second LDO regulator 215 to the second LDO regulator 215, thereby to switch on or off the second LDO regulator 215 to turn on and off the SRAM circuit 30. It is even possible to transmit the signal changing the output voltage of the second LDO regulator 215 to change the input voltage of the SRAM array 33. When determining the input voltage of the SRAM array 33, the magnitude of the set voltage can be decreased with an increase of a junction temperature of the FPGA chip 10 (the junction temperature of the FPGA chip 10 refers to the temperature inside the FPGA chip 10), which can ensure the running speed and reliability of the FPGA chip 10. The two LDO regulators are designed in the power management circuit 21 to provide different configurable power supply voltages to the WLDR (word line drive circuit 31) and the SRAM array 33 in the SRAM circuit 30 respectively. The two LDO regulators obtain accurate reference voltages from the bandgap reference circuit 211 and generate accurate output power supplies, which can improve the running speed of the SRAM circuit 30. The specific process is shown in FIG. 2 and FIG. 3, after the power management circuit 21 powers on the word line drive circuit 31, the power management controller 22 and the oscillator 23 use the timing function to delay a time length T3, and then transmit a signal (which can be represented by por_sram_n) enabling the power management circuit 21 to power on the SRAM array 33 to the second LDO regulator 215.

Referring to FIG. 2 and FIG. 3, the power management controller 22 and the oscillator 23 can be configured to control the power management circuit 21 to pull up the power supply voltage of the word line drive circuit 31 to be no less than the set voltage after powering on the SRAM array 33 but before erasing the SRAM array 33. The power supply voltage of the word line drive circuit 31 is no less than the set voltage in response to the power management circuit 21 erasing the SRAM array 33. Specifically, referring to FIG. 2 and FIG. 3, after the power management circuit 21 powers on the SRAM array 33, that is, the pre-erasing stage ends, at this time, the power management controller 22 and the oscillator 23 use their clock control function to delay a time length T3, and then transmit a signal (which can be represented by rst_n) of determining the end of the pre-erasing stage to the first LDO regulator 213. As shown in FIG. 2 and FIG. 3, after the power management circuit 21 powers on the SRAM array 33 and the first LDO regulator 213 receives the signal determining the end of the pre-erasing stage, the power supply voltage of the word line drive circuit 31 is pulled up to be no less than the set voltage, and V1 in FIG. 3 represents the pulled-up power voltage, where V1≥V2. Specifically, the power supply voltage of the word line drive circuit 31 can be equal to the set voltage, or the power supply voltage of the word line drive circuit 31 can be greater than the set voltage. It ensures that the output state of the word line drive circuit 31 of the SRAM circuit 30 is stable.

In addition, at the end of the pre-erasing stage, the circuit management circuit 21 completes the powering-on of the bit line drive circuit 32 to reset a register inside the bit line drive circuit 32.

Referring to FIGS. 1-4, the power management controller 22 and the oscillator 23 are connected to a control circuit 40 in the FPGA chip 10. The control circuit 40 in the FPGA chip 10 can send an erase signal (which can be expressed as erase), a programming signal (which can be expressed as prog_on), and a reading signal (which can be expressed as read_on) to the power management controller 22 and the oscillator 23.

Taking FIG. 2 and FIG. 3 as examples, when the power management controller 22 and the oscillator 23 receive the erase signal sent by the control circuit 40 in FPGA chip 10, at this time, the power management controller 22 and the oscillator 23 delay a time length T4 from the end of the pre-erasing stage, and then the power management controller 22 and the oscillator 23 control the power management circuit 21 to erase the SRAM circuit 30. When the erasing, since the power supply voltage of the word line drive circuit 31 is no less than the set voltage of the SRAM array 33, comparing to use the core voltage as the erase voltage in the related art, the running speed is faster.

Referring to FIGS. 2 and 3, the power management controller 22 and the oscillator 23 can be configured to control the power management circuit 21 to program the SRAM circuit 30 after the SRAM circuit 30 is erased. The power supply voltage of the word line drive circuit 31 is no less than the set voltage in response to power management circuit 21 programming the SRAM circuit 30. Specifically, the power supply voltage of the word line drive circuit 31 can be equal to or greater than the set voltage. It ensures that the SRAM can be written normally. Specifically, after the power management controller 22 and the oscillator 23 receive the programming signal transmitted by the control circuit 40 of the FPGA chip 10, the power management controller 22 controls the power management circuit to program the SRAM array 33.

Continuing to refer to FIGS. 2 and 3, the power management controller 22 and the oscillator 23 can be configured to control the power management circuit 21 to read the SRAM circuit 30 after the power management circuit 21 programs the SRAM circuit 30. The power management controller 22 and the oscillator 23 can be configured to control the power management circuit 21 to pull down the power supply voltage of the word line drive circuit 31 to be the core voltage after the power management circuit 21 programs the SRAM circuit 30 but before reads the SRAM circuit 30. It ensures that SRAM circuit 30 can read normally. Specifically, as shown in FIGS. 2 and 3, after the power management controller 22 and the oscillator 23 receive the programming signal transmitted by the control circuit 40 of the FPGA chip 10, the power management controller 22 controls the power management circuit to program the SRAM array 33. After the power management controller 22 and the oscillator 23 receive the reading signal transmitted by the control circuit 40 of the FPGA chip 10, the power management controller 22 and the oscillator 23 transmit a pre-read signal (vddt_n signal) to the power management circuit 21 to control the power management circuit 21 to pull down the power supply voltage of the word line drive circuit 31 to be the core voltage. After delaying a time length T5, the power supply voltage of the word line drive circuit 31 decreases to be the core voltage. It ensures that the SRAM circuit 30 can read normally.

When designing the above power management controller 22, referring to FIG. 2, the power management controller 22 includes three logic delay circuits 221 and a logic control circuit 222. The logic control circuit 222 can be connected to the control circuit 40 in the FPGA chip 10 to receive different control signals transmitted by the control circuit 40 of the FPGA chip 10 (specifically, the different control signals can be an erase signal, a programming signal and a reading signal). Continuing to refer to FIG. 2, the three logic delay circuits 221 and the logic control circuit 222 are respectively connected to the oscillator 23 to transmit different control signals to the power management circuit 21 at different times. The specific control signals refer to the description of the powering on and will not be repeated here. It should be understood that FIG. 2 shows only one way of setting the power management controller 22. In addition, other devices that can receive the control signals transmitted by the control circuit 40 of the FPGA chip 10 and can transmit different control signals to the power management circuit 21 at different times can also be used.

By designing the power-on reset circuit 212 to determine whether the powering-on of the core voltage and the analog input-output voltage is completed, and after the power-on reset circuit 212 determines that the powering-on of the core voltage and the analog input-output voltage is completed, the power management controller 22 and the oscillator 23 control the power management circuit 21 to power on the SRAM circuit 30. After the SRAM circuit 30 is powered on, the power management controller 22 and the oscillator 23 control the power management circuit to erase the SRAM circuit 30. By using the method of powering-on and then erasing, power-on sequences of internal power supplies are clear, which can avoid the internal logic confusion caused by the failure completions of the powering-on and erasing at the same time, thereby reduce the power consumption of the FPGA chip.

In addition, an embodiment of the present disclosure further provides a FPGA chip 10. The FPGA chip includes a SRAM circuit 30 and any of the above power management systems 20. By designing the power-on reset circuit 212 to determine whether the powering-on of the core voltage and the analog input-output voltage is completed, and after the power-on reset circuit 212 determines that the powering-on of the core voltage and the analog input-output voltage is completed, the power management controller 22 and the oscillator 23 control the power management circuit 21 to power on the SRAM circuit 30. After the SRAM circuit 30 is powered on, the power management controller 22 and the oscillator 23 control the power management circuit to erase the SRAM circuit 30. By using the method of powering-on and then erasing, power-on sequences of internal power supplies are clear, which can avoid the internal logic confusion caused by failure completions of the powering-on and erasing at the same time, thereby reduce the power consumption of the FPGA chip.

In addition, an embodiment of the present disclosure further provides a power management method corresponding to the power management system 20 for the SRAM circuit 30. The power management method includes: after the power-on reset circuit 212 determines that the powering-on of the core voltage and the analog input-output voltage is completed, the power management controller 22 and the oscillator 23 control the power management circuit 21 to power on the SRAM circuit 30, and after the power management circuit 21 powers on the SRAM circuit 30, the power management controller 22 and the oscillator 23 control the power management circuit 21 to erase the SRAM circuit 30. The specific steps and the power supply mode refer to the above description of the power management system 20, which will not be repeated here.

By designing the power-on reset circuit 212 to determine whether the powering-on of the core voltage and the analog input-output voltage is completed, and after the power-on reset circuit 212 determines that the powering-on of the core voltage and the analog input-output voltage is completed, the power management controller 22 and the oscillator 23 control the power management circuit 21 to power on the SRAM circuit 30. After the SRAM circuit 30 is powered on, the power management controller 22 and the oscillator 23 control the power management circuit to erase the SRAM circuit 30. By using the method of powering-on and then erasing, power on sequences of internal power supplies are clear, which can avoid the internal logic confusion caused by the failure completion of the powering-on and erasing at the same time, thereby reduce the power consumption of the FPGA chip.

The power management controller 22 and the oscillator 23 control the power management circuit 21 to power on the word line drive circuit 31 with the core voltage in response to supply power to the SRAM circuit 30. After the word line drive circuit 31 is powered on, the power management controller 22 and the oscillator 23 control the power management circuit 21 to power on the SRAM array 33 with the set voltage. The set voltage is greater than the core voltage. Referring to the above description for specific methods, which will not be repeated here. The running efficiency of the SRAM circuit 30 is improved by using that the power supply voltage (set voltage) of the SRAM array 33 is greater than the core voltage. By supplying power to the word line drive circuit 31 and then to the SRAM array 33, it is ensured that there will be no large current in the power on process of the SRAM array 33, which is convenient to lock the data into the SRAM array 33.

The power management controller 22 and the oscillator 23 control the power management circuit 21 to power on the SRAM array 33 with the set voltage, can include, the power management controller 22 and the oscillator 23 control the second LDO regulator 215 of the power management circuit 21 to power on the SRAM array 33 with the set voltage. It is convenient to power on the SRAM array 33, it ensures the supply of the stable voltage power to the SRAM array 33 and improves the running speed of the SRAM circuit 30. Referring to the above description for specific methods, which will not be repeated here.

The power management method can include: after the power management circuit 21 powers on the SRAM array 33 but before erases the SRAM array 33, the power management controller 22 and the oscillator 23 control the power management circuit 21 to pull up the power supply voltage of the word line drive circuit 31 to be no less than the set voltage, and the power supply voltage of the word line drive circuit 31 is no less than the set voltage in response to the power management circuit 21 erasing the SRAM array 33. Referring to the above description for specific methods, which will not be repeated here. Before the erasing, the power supply voltage of the word line drive circuit 31 is pulled up to be no less than the set voltage. It ensures the stable output state of the word line drive circuit 31 of the SRAM circuit 30.

The power management controller 22 and the oscillator 23 control the power management circuit 21 to pull up the power supply voltage of the word line drive circuit 31 to be no less than the set voltage, can include, the power management controller 22 and the oscillator 23 control the first LDO regulator 213 of the power management circuit 21 to pull up the power supply voltage of the word line drive circuit 31 to be no less than the set voltage. Referring to the above description for specific methods, which will not be repeated here. It is convenient to power on the word line drive circuit 31, it ensures the supply of stable voltage power to the word line drive circuit 31, and improves the running speed of the SRAM circuit 30.

The power management method can include: after the power management circuit 21 erases the SRAM circuit 30, the power management controller 22 and the oscillator 23 control the power management circuit 21 to program the SRAM array 33, the power supply voltage of the word line drive circuit 31 is no less than the set voltage in response to the power management circuit 21 programming the SRAM circuit 30. It ensures that the SRAM can be written normally. Referring to the above description for specific methods, which will not be repeated here.

The power management method can further include: after the power management circuit 21 programs the SRAM circuit 30, the power management controller 22 and the oscillator 23 control the power management circuit 21 to pull down the power supply voltage of the word line drive circuit 31 to be the core voltage, the power management controller 22 and the oscillator 23 control the power management circuit 21 to read the SRAM array 33. The power supply voltage of the word line drive circuit 31 is equal to the core voltage in response to the power management circuit 21 reading the SRAM array 33. It ensures that the SRAM circuit 30 can read normally. Referring to the above description for specific methods, which will not be repeated here.

What is claimed is:

1. A power management system for a static random access memory (SRAM) circuit, adapted for a field programmable gate array (FPGA) chip; the power management system comprising:
   a power management circuit, configured to supply power to the SRAM circuit, wherein power supply voltages of the power management circuit comprise a core voltage and an analog input-output voltage, and the power management circuit comprises a power-on reset circuit configured to determine whether powering-on of the core voltage and the analog input-output voltage is completed; and
   a power management controller and an oscillator, configured to control the power management circuit to power on the SRAM circuit after the power-on reset circuit determines that the powering-on of the core voltage and the analog input-output voltage is completed; and
   wherein the power management controller and the oscillator are further configured to control the power management circuit to erase the SRAM circuit after the SRAM circuit is powered on.

2. The power management system according to claim 1, wherein the SRAM circuit comprises a SRAM array, a word line drive circuit and a bit line drive circuit; and
   wherein the power management circuit powers on the SRAM circuit, comprises:
   the power management controller and the oscillator control the power management circuit to power on the word line drive circuit with the core voltage; and
   the power management controller and the oscillator control the power management circuit to power on the SRAM array with a set voltage, after the word line drive circuit is powered on; wherein the set voltage is greater than the core voltage.

3. The power management system according to claim 2, wherein the power management controller and the oscillator are configured to control the power management circuit to pull up a power supply voltage of the word line drive circuit to be no less than the set voltage after the SRAM array is powered on but before the SRAM array is erased; and
   wherein the power supply voltage of the word line drive circuit is no less than the set voltage in response to the power management circuit erasing the SRAM array.

4. The power management system according to claim 3, wherein a magnitude of the set voltage is decreased with an increase of a junction temperature of the FPGA chip.

5. The power management system according to claim 3, wherein the power management circuit further comprises:
   a bandgap reference circuit, wherein a power supply voltage of the bandgap reference circuit is the analog input-output voltage, and the power-on reset circuit is connected to an output end of the bandgap reference module;
   a first low dropout (LDO) regulator, connected to an output end of the bandgap reference circuit and configured to supply power to the word line drive circuit; and
   a second LDO regulator, connected to the bandgap reference circuit and configured to supply power to the SRAM array.

6. The power management system according to claim 5, wherein the power management circuit further comprises:
   a switch circuit, configured to provide stabilized the core voltage to the word line drive circuit, wherein the switch circuit is connected to an output end of the first LDO regulator.

7. The power management system according to claim 5, wherein the second LDO regulator is connected to an output end of the bandgap reference circuit, an output end of the second LOD regulator is connected to the SRAM array, and the second LDO regulator is configured to supply power to the SRAM array.

8. The power management system according to claim 3, wherein the power management controller and the oscillator are configured to control the power management circuit to program the SRAM circuit after the SRAM circuit is erased; and
   wherein the power supply voltage of the word line drive circuit is no less than the set voltage in response to the power management circuit programming the SRAM circuit.

9. The power management system according to claim 8, wherein the power management controller and the oscillator are configured to control the power management circuit to read the SRAM circuit after the power management circuit programs the SRAM circuit; and
   wherein the power management controller and the oscillator are configured to control the power management circuit to pull down the power supply voltage of the word line drive circuit to be the core voltage after the power management circuit programs the SRAM circuit but before reads the SRAM circuit.

10. The power management system according to claim 1, wherein the power management controller comprises three logic delay circuits and a logic control circuit, and the three logic circuits and the logic circuit are connected to the oscillator.

11. A FPGA chip, comprising:
a SRAM circuit; and
a power management system, comprising:
   a power management circuit, comprising a power-on reset circuit configured to determine whether powering-on of a core voltage and an analog input-output voltage of the power management circuit is completed; and
   a power management controller and an oscillator, cooperatively configured to control the power management circuit to power on the SRAM circuit after the power-on reset circuit determines that the powering-on of the core voltage and the analog input-output voltage is completed, and configured to control the power management circuit to erase the SRAM circuit after the SRAM circuit is powered on.

12. The FPGA chip according to claim 11, wherein the FPGA chip comprises a control circuit, the control circuit is connected to the power management controller and the oscillator of the power management system, the control circuit is configured to issue different control signals to the power management controller and the oscillator, and the different control signals comprise an erase signal, a programming signal and a reading signal.

13. A power management method, implemented by a power management system, wherein the power management system comprises a power management circuit, a power management controller and an oscillator, the power management circuit comprises a power-on reset circuit, and the power management method comprises:
   the power management controller and the oscillator control the power management circuit to power on a SRAM circuit, after the power-on reset circuit determines that powering-on of a core voltage and an analog input-output voltage of power supply voltages of the power management circuit is completed; and
   the power management controller and the oscillator control the power management circuit to erase the SRAM circuit, after the power management circuit powers on the SRAM circuit.

14. The power management method according to claim 13, wherein the SRAM circuit comprises a SRAM array, a word line drive circuit and a bit line drive circuit; and
   wherein the power management circuit powers on the SRAM circuit, comprises:
      the power management controller and the oscillator control the power management circuit to power on the word line drive circuit with the core voltage; and
      the power management controller and the oscillator control the power management circuit to power on the SRAM array with a set voltage, after the word line drive circuit is powered on; wherein the set voltage is greater than the core voltage.

15. The power management method according to claim 14, wherein the power management controller and the oscillator control the power management circuit to power on the SRAM array with the set voltage, comprises:
   the power management controller and the oscillator control a second LDO regulator of the power management circuit to power on the SRAM array with the set voltage.

16. The power management method according to claim 14, further comprising:
   the power management controller and the oscillator control the power management circuit to pull up a power supply voltage of the word line drive circuit to be no less than the set voltage, after the power management circuit powers on the SRAM array but before erases the SRAM array; wherein the power supply voltage of the word line drive circuit is no less than the set voltage, in response to the power management circuit erasing the SRAM array.

17. The power management method according to claim 16, wherein the power management controller and the oscillator control the power management circuit to pull up the power supply voltage of the word line drive circuit to be no less than the set voltage, comprises:
   the power management controller and the oscillator control a first LDO regulator of the power management circuit to pull up the power supply voltage of the word line drive circuit to be no less than the set voltage.

18. The power management method according to claim 16, further comprising:
   the power management controller and the oscillator control the power management circuit to program the SRAM array, after the power management circuit erases the SRAM circuit; wherein the power supply voltage of the word line drive circuit is no less than the set voltage in response to the power management circuit programming the SRAM circuit.

19. The power management method according to claim 18, further comprising:
   the power management controller and the oscillator control the power management circuit to pull down the power supply voltage of the word line drive circuit to be the core voltage, after the power management circuit programs the SRAM circuit; and
   the power management controller and the oscillator control the power management circuit to read the SRAM array, wherein the power supply voltage of the word line drive circuit is equal to the core voltage in response to the power management circuit reading the SRAM array.

20. The power management method according to claim 14, wherein the power management controller and the oscillator control the power management circuit to power on the word line drive circuit with the core voltage, comprises:
   the power-on reset circuit transmits a powering-on and resetting completion signal to the power management controller and the oscillator, in response to the power-on reset circuit determining that the powering-on of the core voltage and the analog input-output voltage is completed; and
   the power management controller and the oscillator, after receiving the powering-on and resetting completion signal, use a timing function of the oscillator to delay a first time length and then enable the power management circuit to power on the word line drive circuit.

* * * * *